United States Patent [19]

Okawa et al.

[11] Patent Number: 5,406,164
[45] Date of Patent: Apr. 11, 1995

[54] MULTILAYER PIEZOELECTRIC ELEMENT

[75] Inventors: Yasuo Okawa, Nagoya; Yasuji Chikaoka, Ama; Yasuo Imoto, Nagoya, all of Japan

[73] Assignee: Brother Kogyo Kabushiki Kaisha, Nagoya, Japan

[21] Appl. No.: 233,254

[22] Filed: Apr. 26, 1994

[30] Foreign Application Priority Data

Jun. 10, 1993 [JP] Japan ............................... 5-138140
Aug. 6, 1993 [JP] Japan ............................... 5-196380

[51] Int. Cl.6 .......................................... H01L 41/08
[52] U.S. Cl. ................................. 310/366; 310/364; 310/328
[58] Field of Search ............... 310/328, 363, 364, 366

[56] References Cited

U.S. PATENT DOCUMENTS

| 4,523,121 | 6/1985 | Takahashi et al. | 310/334 |
|---|---|---|---|
| 4,803,763 | 2/1989 | Eturo et al. | 310/328 |
| 5,113,566 | 5/1992 | Weekamp et al. | 310/328 |
| 5,251,094 | 10/1993 | Amano et al. | 361/308.2 |
| 5,254,212 | 10/1993 | Someji et al. | 156/630 |
| 5,339,068 | 8/1994 | Tsunoda et al. | 338/332 |

FOREIGN PATENT DOCUMENTS 62-211974  9/1987  Japan .
63-17354   4/1988  Japan .

*Primary Examiner*—Thomas M. Dougherty
*Attorney, Agent, or Firm*—Kane, Dalsimer, Sullivan, Kurucz, Levy, Eisele and Richard

[57] ABSTRACT

Disclosed is a multilayer piezoelectric element in which the conductive layers, each having a first layer including conductive particles and a second insulating layer, are formed on two side surfaces, each surface opposing with each other, of the multilayer piezoelectric element that a plurality of the piezoelectric plates and the internal electrodes are alternately stacked and the conductive portions are alternately formed in the conductive layer based on the conductive particles corresponding to the internal electrodes disposed on each side surface, thereby the internal electrodes and the external electrodes are electrically connected with each other on each side surface through the conductive portions. And further, it is disclosed a multilayer piezoelectric element in which the conductive protrusions are alternately formed by nickel plating at ends of the internal electrodes disposed on both two side surfaces of the multilayer piezoelectric element that a plurality of the piezoelectric plates and the internal electrodes are alternately stacked and the conductive layers, each having a first layer including conductive particles and a second insulating layer, are formed over both side surfaces and further the conductive portions are partially formed in the conductive layers by selectively pressing thereof through the conductive protrusions, thereby the internal electrodes and the external electrodes are electrically connected with each other through the conductive protrusions and the conductive portions.

36 Claims, 11 Drawing Sheets

FIG. 14 (a) PRIOR ART
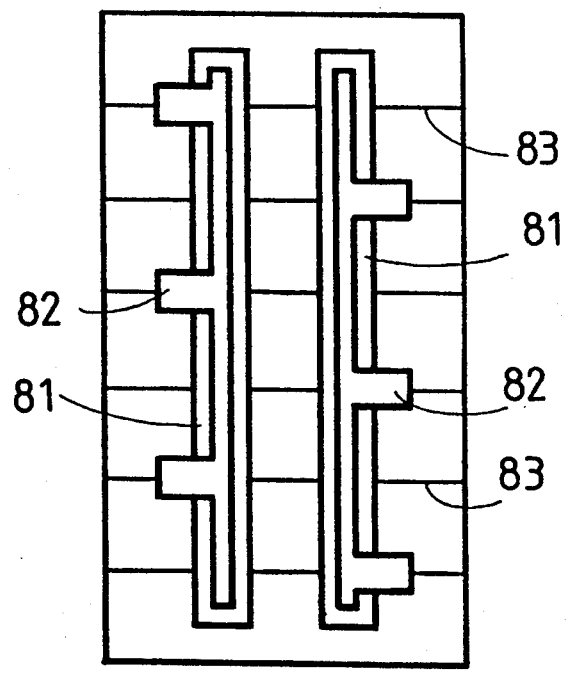
FIG. 14 (b) PRIOR ART
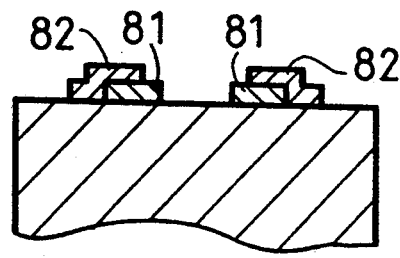

MULTILAYER PIEZOELECTRIC ELEMENT

BACKGROUND OF THE INVENTION

1. Field of the Invention

The present invention relates to a multilayer piezoelectric element constructed from a plurality of thin piezoelectric layers which are stacked with each other in a vertical direction, through which it can be obtained displacement in the vertical direction (stacked direction) when a voltage is applied thereto.

2. Description of Related Art

In general, when a multilayer piezoelectric element is produced, it is necessary that internal electrodes positioned between piezoelectric layers are alternately connected by an external electrode at a side surface of the element. Here, in case that the multilayer piezoelectric element is produced according to a conventional method through which a condenser type of the piezoelectric element is produced, an area of the internal electrode becomes narrower than a sectional area (surface area) of the element, thereby an electric field cannot be generated over the sectional area thereof. As a result, it is obstructed that the multilayer piezoelectric element suitably displaces according to its characteristic and displacing force is concentrated on an uneven portion in the element, thereby the multilayer piezoelectric element is apt to be destroyed.

Further, it is difficult to position and stack each of the piezoelectric layers with correct relationship thereamong when the piezoelectric layers are stacked with each other. And on the basis of difficulty in both positioning and stacking of the piezoelectric layers, there is a limit that the several tens of the piezoelectric layers can only be multilayered at best. Thereby, since the displacement quantity of the piezoelectric element proportions to a multilayered number of the piezoelectric layers when the same voltage is applied thereto, it is very difficult to produce the piezoelectric element having larger displaceability.

In order to dissolve the above problem, it is proposed a method in which the multilayer piezoelectric element is produced by multilayering the piezoelectric layers on each surface of which the internal electrode is printed thereover. Here, in the multilayer piezoelectric element produced according to the above, the area of the internal electrode on the piezoelectric layer is as same as the sectional area of the multilayer piezoelectric element. In such construction of the piezoelectric element, in order to alternately connect the internal electrodes through the external electrode, it is necessary to conduct an insulating process according to methods, for example, disclosed in U.S. Pat. No. 4,523,121 (corresponding to FIG. 13) and Japanese Patent Application Laid Open No. 62-211,974 (corresponding to FIG. 14).

Here, it will be described methods of U.S. Pat. No. 4,523,121 and Japanese Patent Application, referring to FIGS. 13 and 14. That is to say, in the electrostrictive element disclosed in FIG. 13, insulation layers 71 composed of glass are alternately formed on both side surfaces of the element by screen printing method or cataphoresis method and thereafter baking. And further, silver paste is coated on the both side surfaces of the element so as to form external electrodes 72. As a result, on each side surface of the element, internal electrodes 73 are alternately connected through the external electrodes 72.

In the laminated piezoelectric element disclosed in FIGS. 14(a) and 14(b), insulation layers 81 composed of glass are formed on a side surface of the element by screen printing method or cataphoresis method and thereafter baking and internal electrodes 83 are alternately connected to external electrodes 82 formed on the insulation layers 81 so as to partially overlap with each other.

However, as understandable from FIGS. 13 and 14, in the elements shown in FIGS. 13, 14, two additional processes are necessitated to produce the elements. The first process is to form the insulation layers 71, 81 on the side surface(s) of the elements. And the second process is to form the external electrodes 72, 82 over the insulation layers 71, 81 in order to connect both the internal electrodes 73, 83 and the external electrodes 72, 82. And further in both cases, the first process and the second process cannot be conducted at the same time since the insulation layers 71, 81 are formed and thereafter the external electrodes 72, 82 are formed, and furthermore, both the insulation layers 71, 81 and the the external electrodes 72, 82 have to be formed directly on the piezoelectric element body. Thus, there is a problem that more processes are necessary and yield for producing the piezoelectric element becomes lower.

And in case of the electrostrictive element of FIG. 13, the insulation layers 71 are alternately formed on the end portions of the internal electrodes 73, the end portions thereof being exposed on the side surfaces of the element. But, in case that the insulation layers 71 are formed by using the screen printing method, it is necessary to precisely determine printing positions of the insulation layers 71. Therefore, it will be possible that deviation of the printing positions occurs and grazing or running of the insulation layers 71 occurs. Based on such deviation, grazing or running of the insulation layers 71, there is a problem that portions which are to be connected are not efficiently connected and on the other hand, portions which are to be insulated are unnecessarily connected. Further, in case that the insulation layers 71 are formed by using the cataphoresis method, it is difficult to uniformly form the insulation layers 71 which have a thickness to be able to resist drive voltage applied to the element, therefore there is a problem that portions which are to be insulated are connected due to dielectric breakdown.

On the other hand, in case of the piezoelectric element disclosed in FIG. 14, though it is comparatively easy to form the insulation layers 81, however, it is difficult to connect the external electrodes 82 and the internal electrodes 83. For instance, if the screen printing method is utilized, it is difficult to uniformly coat the conductive paste (silver paste) on a portion having difference in level, which occurs between the side surface of the element and the surface of the insulation layers 81, in addition to the problem that it is unable to precisely determine the printing positions. Thus, there is a problem that portions which are to be connected are not efficiently connected and on the other hand, portions which are to be insulated are unnecessarily connected.

And further, even if the screen printing method or the cataphoresis method is utilized to form the insulation layers 71, 81, it is necessary an additional process to bake the insulation layers 71, 81 and the conductive paste resulting the external electrodes 72, 82. Therefore, there is a problem that producing cost of the element becomes higher and it is difficult to connect both the internal electrodes 73, 83 and the external electrodes 72, 82 if thickness of the piezoelectric layer is thinner than a thickness below 100 μm.

Then, in order to dissolve the above problems, the inventors of the present invention attempted to produce the multilayer piezoelectric element by utilizing an anisotropic conductive film shown in FIG. 15, in which conductive particles are dispersed. The anisotropic conductive film is composed from an adhesive sheet 91 having a thickness of 100 μm in which a plurality of conductive particles 92, each particle size being several tens μm, are dispersed so as not to contact with each other. And the anisotropic conductive film is possible to have conductive portions therein, the portions having conductivity only to a thickness direction of the anisotropic conductive film, by partially pressing the anisotropic conductive film to the thickness direction thereof, thereby the conductive particles 92 are contacted with each other at the pressed portions.

By utilizing the anisotropic conductive film to produce the multilayer piezoelectric element, as mentioned above, producing process of the piezoelectric element can be simplified since it is possible to omit both the process to form the insulation layers 71, 81 and the process to bake the insulation layers 71, 81 and the conductive paste resulting the external electrodes 72, 82. Thus, producing cost of the piezoelectric element can be reduced. And connective inferiority and insulation inferiority due to grazing or running does not occur since the conductive paste or the insulation paste are not used in the process that the external electrodes 72, 82 are formed.

However, in case that the anisotropic conductive film in which the conductive particles 92 are dispersed as shown in FIG. 15 is utilized, the conductive particles 92 are apt to be contacted with each other to a direction normal to the thickness direction of the anisotropic conductive film if distances between the conductive particles 92 dispersed in the adhesive sheet 91 are narrow, when the anisotropic conductive film is partially pressed. As a result, the conductive portions are unnecessarily expanded to the direction normal to the thickness direction of the anisotropic conductive film. Therefore, if the thickness of one piezoelectric layer including the internal electrode 73, 83 becomes thinner than about 100 μm, there is a problem that it is very difficult to alternately connect the internal electrodes 73, 83.

SUMMARY OF THE INVENTION

It is accordingly an object of the present invention to overcome the above mentioned problems and to provide a multilayer piezoelectric element through which not only it can simplify process to produce the multilayer piezoelectric element by omitting a process to form insulation layers but also it can reliably connect external electrodes and internal electrodes without precise positioning thereof, and in case of thin multilayer piezoelectric element in which very thin piezoelectric layers are stacked with each other, it can prevent conductive inferiority and insulation inferiority from being yielded.

In order to overcome the above object, the first invention provides a multilayer piezoelectric element having a first and a second side surfaces opposing with each other in which a plurality of piezoelectric layers and a plurality of internal electrodes are alternately stacked with each other, the multilayer piezoelectric element comprising :

a pair of conductive layers which are formed on the first and the second side surfaces of the multilayer piezoelectric element so as to cover the internal electrodes exposed on the first and the second side surfaces, the conductive layer having a first layer in which conductive particles are included and a second insulating layer and conductive portions being formed in the conductive layers based on the conductive particles in the first layer; and a pair of external electrodes which are formed on the conductive layers on both the first and the second side surfaces, the external electrode being electrically connected to the internal electrodes through the conductive portions formed in the conductive layer.

According to the first invention, the conductive layers formed on the first side and the second side surfaces of the multilayer piezoelectric element have a double-layered structure constructed from the first layer in which the conductive particles are included and the second insulating layer.

And when the conductive layers are partially pressed by the pressing device, the conductive particles in the first layer pierces the second insulating layer into contact with the internal electrodes at the positions selectively pressed by the pressing device. By this way, the conductive portions are selectively formed in the conductive layers and the external electrodes are electrically connected to the internal electrodes through the conductive portions.

At that time, portions of the conductive layers which are not pressed by the pressing device are certainly insulated from the conductive portions by the second insulating layer. Thus, there is no limit that the conductive particles have to be separately dispersed in the first layer with an enough distance therebetween, so that the conductive particles does not contact with each other to direction normal to thickness direction of the first layer. Accordingly, the conductive particles can be entirely dispersed in the first layer, therefore the internal electrodes can be alternately and certainly connected to the external electrodes with each other in case that the multilayer piezoelectric element is constructed from the piezoelectric layers which are made very thin.

And the multilayer piezoelectric element can be obtained by only forming the conductive layers and the external electrodes on both the first and the second side surfaces of the element, thereby construction of the multilayer piezoelectric element can be simplified. Therefore, it can omit both step for forming the insulation layer and step for baking thereof to manufacture the multilayer piezoelectric element. As a result, manufacturing cost of the multilayer piezoelectric element can be reduced. And since the internal electrodes are electrically connected to the external electrodes through the conductive portions formed in the conductive layers by selectively pressing thereof, it is not necessary the conductive paste to form the external electrodes or to connect both the internal electrodes and the external electrodes, thereby it can prevent conducive inferiority and insulation inferiority from being yielded.

And further the second present invention provides a multilayer piezoelectric element having a first and a second side surfaces opposing with each other in which a plurality of piezoelectric layers and a plurality of internal electrodes are alternately stacked with each other, the multilayer piezoelectric element comprising:

a plurality of conductive protrusions alternately formed at end positions of the internal electrodes exposed on both the first and the second side surfaces;

a pair of conductive layers which are formed on the first and the second side surfaces of the multilayer piezoelectric element so as to cover the internal electrodes exposed on the first and the second side surfaces, the conductive layer having a first layer in which conductive particles are included and a second insulating layer and conductive portions being formed in the conductive layers based on the conductive particles in the first layer; and a pair of external electrodes which are formed on the conductive layers on both the first and the second side surfaces, the external electrode being electrically connected to the internal electrodes through the conductive protrusions and the conductive portions formed in the conductive layer According to the second invention, the conductive protrusions are alternately formed at end positions of the internal electrodes exposed on both the first and the second side surfaces and the conductive layers formed on the first side and the second side surfaces of the multilayer piezoelectric element have a double-layered structure constructed from the first layer in which the conductive particles are included and the second insulating layer.

And when the conductive layers are partially pressed by the pressing device, pressure added to the pressed portions locally becomes high by means of the conductive protrusions formed on the first and the second side surfaces. Thus, the conductive particles in the first layer pierces the second insulating layer into contact with the internal electrodes at the positions selectively pressed by the pressing device, in cooperation with the conductive protrusions. By this way, the conductive portions are selectively formed in the conductive layers and the external electrodes are electrically connected to the internal electrodes through conductive protrusions and the conductive portions.

At that time, pressure added to portions of the conductive layers where the conductive protrusions does not exist is not so high and thus, portions of the conductive layers which are not pressed by the pressing device are certainly insulated from the conductive portions by the second insulating layer. Thus, there is no limit that the conductive particles have to be separately dispersed in the first layer with an enough distance therebetween, so that the conductive particles does not contact with each other to direction normal to thickness direction of the first layer. Accordingly, the conductive particles can be entirely dispersed in the first layer, therefore the internal electrodes can be alternately and certainly connected to the external electrodes with each other in case that the multilayer piezoelectric element is constructed from the piezoelectric layers which are made very thin.

Further, the multilayer piezoelectric element can be obtained by only forming the conductive layers and the external electrodes on both the first and the second side surfaces of the element, thereby construction of the multilayer piezoelectric element can be simplified. Therefore, it can omit both step for forming the insulation layer and step for baking thereof to manufacture the multilayer piezoelectric element. As a result, manufacturing cost of the multilayer piezoelectric element can be reduced.

And in particular, the internal electrodes and the external electrodes can be connected with each other by forming the conductive portions in the conductive layers while selectively pressing the conductive layers through the conductive protrusions formed on both the first and the second side surfaces corresponding to the internal electrodes. Therefore, the internal electrodes and the external electrodes can be connected without precise positioning thereof.

And further, since the internal electrodes are electrically connected to the external electrodes through the conductive portions formed in the conductive layers by selectively pressing thereof, it is not necessary the conductive paste to form the external electrodes or to connect both the internal electrodes and the external electrodes, thereby it can prevent conducive inferiority and insulation inferiority from being yielded.

The above and further objects and novel features of the invention will more fully appear from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The invention will be described with reference to the following drawings, wherein:

FIG. 14 is a schematic view of the other conventional multilayer piezoelectric element, wherein FIG. 14(a) is a side view of the element and FIG. 14(b) is a sectional view of the element.

DETAILED DESCRIPTION OF THE PREFERRED EMBODIMENT

A detailed description of the first preferred embodiment of the present invention will be given referring to the accompanying drawings.

Figure 1:
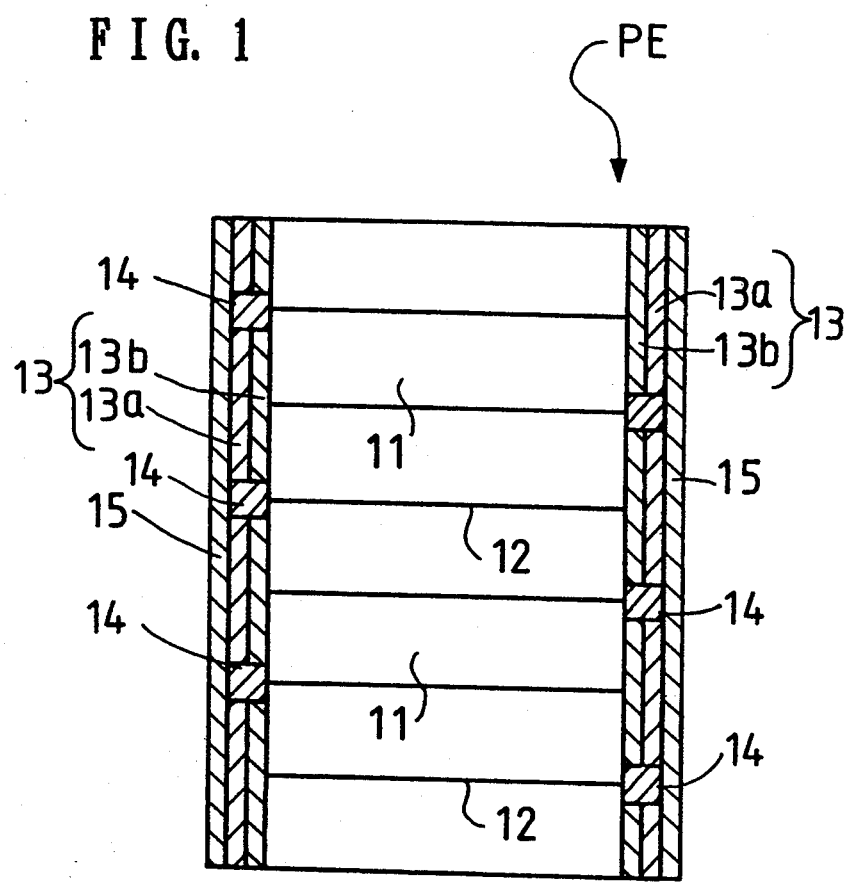
FIG. 1 is a sectional view of a multilayer piezoelectric element according to the first embodiment of the present invention.

In FIG. 1, a multilayer piezoelectric element PE is constructed by alternately stacking a plurality of piezoelectric plates 11 and a plurality of internal electrodes 12. The piezoelectric element PE has four side surfaces and on each side surface the piezoelectric plates 11 and the internal electrodes 12 are exposed. And on two side surfaces which opposes with each other, conductive films 13 are attached along a stacking direction of the piezoelectric plates 11 (vertical direction in FIG. 1) so that the conductive films 13 cover all of the piezoelectric plates 11 exposed on each of the two side surfaces.

The conductive film 13 is constructed from two layers 13a and 13b. The first layer 13a is comprised from an adhesive layer which includes conductive particles (mentioned hereinafter) therein. And the second layer 13b is comprised from an adhesive layer which does not include conductive particles (mentioned hereinafter).

And in each of the conductive films 13, a plurality of conductive portions 14 are alternately formed as shown in FIG. 1. In FIG. 1, that is to say, in the left conductive film 13, three conductive portions 14 in a first group are formed at positions, each corresponding to the first internal electrode 12, the third internal electrode 12 and the fifth internal electrode 12, from the upper surface of the element PE respectively. And in the right conductive film 13, three conductive portions 14 in a second group are formed at positions, each corresponding to the second internal electrode 12, the fourth internal electrode 12 and the sixth internal electrode 12, from the upper surface of the element PE respectively. That is to say, the conductive portions 14 are formed every other internal electrode 12 at both sides of the piezoelectric element PE. Manufacturing process of the conductive portions 14 will be described hereinafter.

Further, on each of the conductive films 13, a copper foil 15 is adhered. The copper foil 15 acts as an external electrode. Based on that the copper foils 15 are formed on the conductive films 13, the first, the third and the fifth internal electrodes 12 are electrically connected to the copper foil 15 formed on the left conductive film 13 through the conductive portions 14 and the second, the fourth and the sixth internal electrodes 12 are electrically connected to the copper foil 15 formed on the right conductive film 13 through the conductive portions 14.

Next, manufacturing process of the multilayer piezoelectric element PE shown in FIG. 1 will be described referring to FIGS. 2–5.

At first, piezoelectric material including PZT (which is compound of lead titanate and lead zirconate) as main component is prepared in a desired composition and thereafter the piezoelectric material is ground into powder after being provisionally baked at 850° C. And binder of 5 weight parts, plasticizer and defoaming agent of trace quantity are added to the powder of the piezoelectric material and thereafter dispersed in organic solvent into slurry state. And the thus obtained slurry is formed into a sheet form with a predetermined thickness by using doctor-blade method, thereby a green sheet, which is utilized to form the piezoelectric plates 11, is obtained.

Figure 2A:
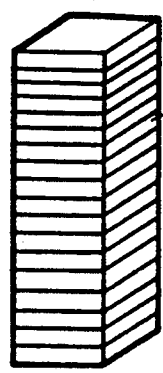
FIG. 2A is a schematic view of one multilayer piezoelectric element of FIG. 2.
Figure 2:
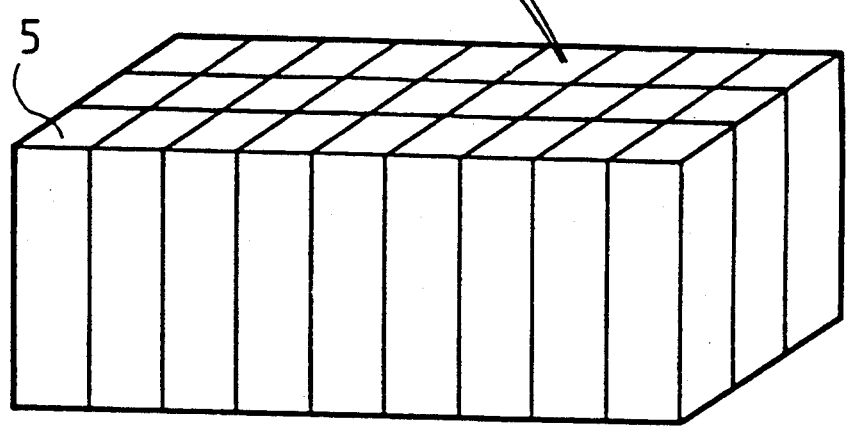
FIG. 2 is a schematic view to explain a state where one multilayer piezoelectric element is cut out from a baked multilayer block.

Thereafter, palladium (Pd) paste is coated on the green sheet by screen printing method so as to form the internal electrode 12. Here, instead of the palladium paste, it is utilizable conductive paste including noble metal such as silver or platinum. The green sheet with palladium paste thereon is punched into a predetermined size. A plurality of the punched green sheets are stacked with each other and hot-pressed into one body. After cleaning thereof, the stacked body is baked at about 1200° C. and a baked multilayer block 5 is obtained as shown in FIG. 2. The multilayer block 5 is sliced into a plurality of element units 6.

Figure 3:
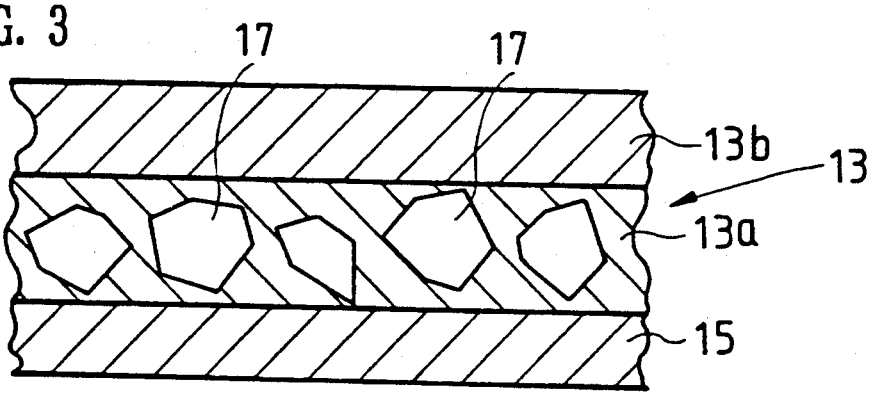
FIG. 3 is a sectional view of a copper foil as an external electrode and a conductive film, both being adhered with each other.

On the other hand, separately from the element units 6, the conductive film 13 is formed on the copper foil 15 as follows. First, as shown in FIG. 3, resinous adhesive including copper powder 17 (conductive particles) with average particle size of 20–30 $\mu$m is coated onto the copper foil 15.

Here, for instance, adhesive composed of thermosetting epoxy resin including the copper powder 17 is coated with a thickness of about 50 $\mu$m onto the copper foil 15 and the coated adhesive is made semi-cured tacky state by heating at a temperature lower than curing point thereof. Further, only the same adhesive not including the copper powder 17 is uniformly coated onto the tacky adhesive already coated on the copper foil 15 and heated into a tacky state. Thereby, the first layer 13a composed of epoxy resin adhesive including the copper powder 17 as the conductive particles and the second layer 13b only composed of epoxy resin adhesive, are formed on the copper foil 15. According to this, the conductive film 13 is concluded to have double-layered structure.

Thereafter, the conductive film 13 with the copper foil 15 prepared according to the above is cut with a width narrower than that of the element unit 6, then the conductive films 13 which are cut out are provisionally adhered onto two side surfaces of the element unit 6, each side surface opposing with each other, so that the conductive film 13 covers all of the piezoelectric plates 11 exposed thereon.

Figure 4:
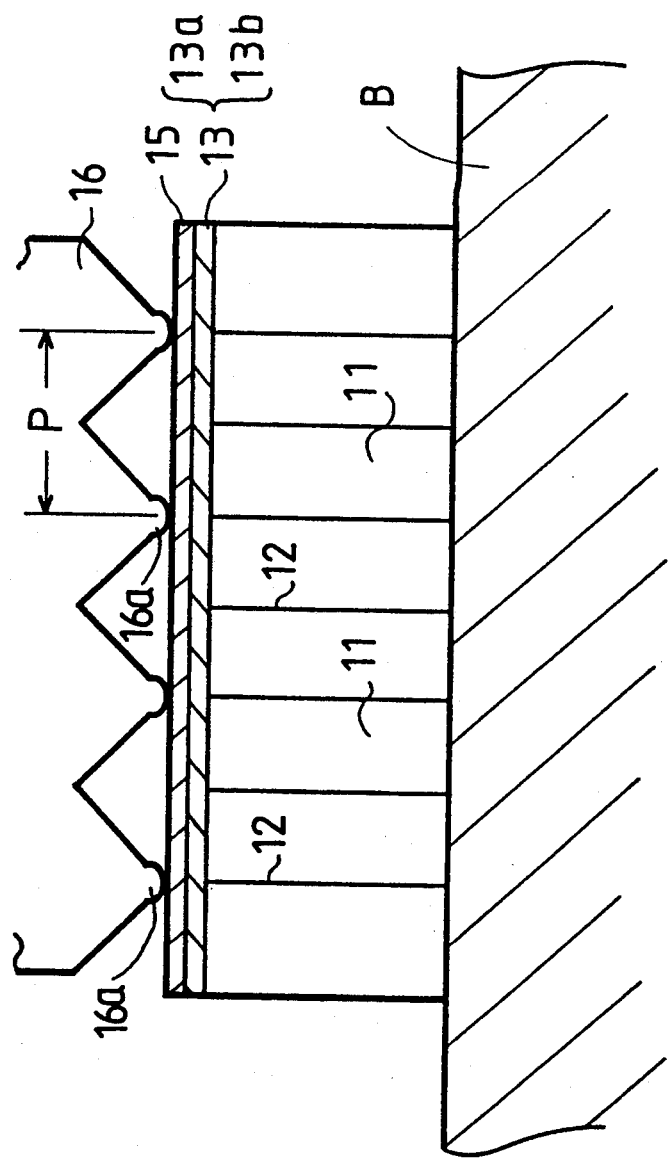
FIG. 4 is a schematic view to explain a state where an conductive film attached to a side surface of the multilayer piezoelectric element is selectively pressed.

And as shown in FIG. 4, the conductive film 13 with the copper foil 15 is selectively pressed by using a pressing device 16. Here, in the pressing device 16, a plurality of projections 16a, each projection 16a being formed so that the top portion has an arc shape with radius R of about 0.05 mm, are formed on a pressing surface and the projections 16a are arranged thereon with a pitch P corresponding to a twice distance between the internal electrodes 12.

Figure 5:
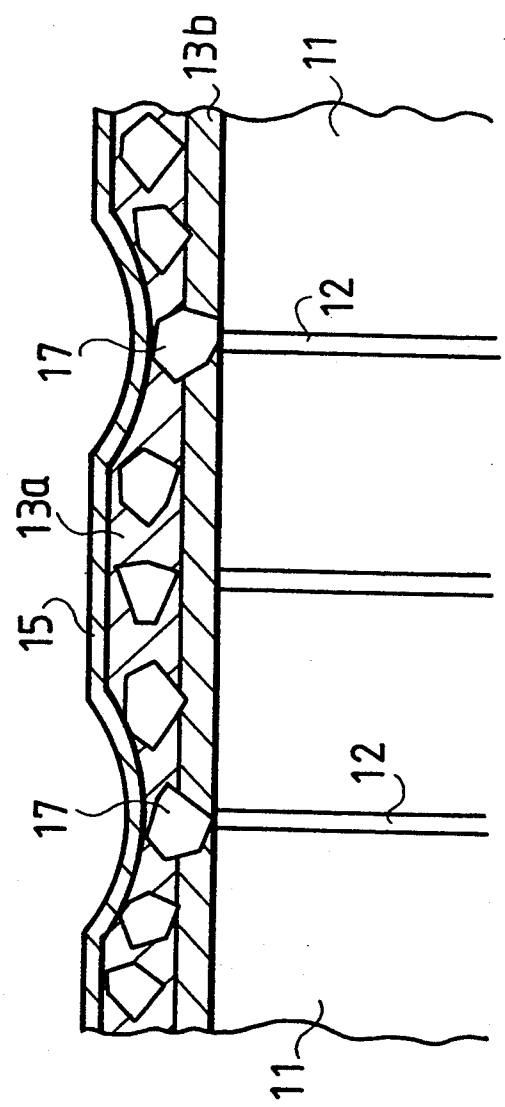
FIG. 5 is a schematic sectional view to explain a state where conductive portions are formed in the conductive film by partially pressing thereof.

At the time that the conductive film 13 with the copper foil 15 is pressed, the projections 16a are positioned so that each projection 16a alternately corresponds to the internal electrode 12 and thereafter the conductive film 13 is heated at 150° C. for 30 minutes while predetermined weight is loaded through the pressing device 16. As a result, the conductive film 13 and the copper foil 15 are adhered onto the element unit 8. And at the same time, the conductive particles (copper powder) 17 included in pressed portions of the first layer 13a pierces the second layer 13b not including the conductive particles 17, as shown in FIG. 5 and thereby the conductive particles 17 are contacted to both the internal electrodes 12 and the copper foil 15. By this way, the conductive portions 14 are formed in the conductive film 13. As a result, the internal electrodes 12 are alternately and electrically connected to the copper foil 15 acting as the external electrode as shown in FIG. 1.

Therefore, supposing that the conductive film 13 is adhered, for example, onto the left side surface of the multilayer piezoelectric element PE, the first, the third and the fifth internal electrodes 12 are alternately connected to the copper foil 15 through the conductive portions 14.

In addition to the above, the same conductive film 13 with the copper foil 15 is selectively pressed on the other side surface of the multilayer piezoelectric element PE by using the pressing device 16, according to the same manner mentioned above. Therefore, as shown in FIG. 1, supposing that the laminated sheet is adhered, for example, onto the right side surface of the multilayer piezoelectric element PE, the second, the fourth and the sixth internal electrodes 12 are alternately connected to the copper foil 15 through the conductive portions 14. In such case, since the conductive film 13 already adhered onto one surface (the left side surface) of the element PE is set on a base B (see FIG. 4) so that the conductive film 13 is arranged at the lower position, pressure is loaded to the conductive film 13 when the conductive film 13 on the other surface (the right side surface) of the element PE is pressed by the pressing device 16. However, the pressure is entirely loaded over the conductive film 13, thus only the small pressure is locally loaded. As a result, it is unnecessary to fear that non-conductive portions (that is, portions except for the conductive portions 14) in the conductive film 13 adhered onto one surface of the element PE become conductive.

Thereafter, lead line for supplying voltage is attached to a part of the copper foil 15 and the thus constructed multilayer piezoelectric element PE is polarized and installed in a cover case.

Next, a detailed description of the second preferred embodiment of the present invention will be given hereinafter.

Figure 6:
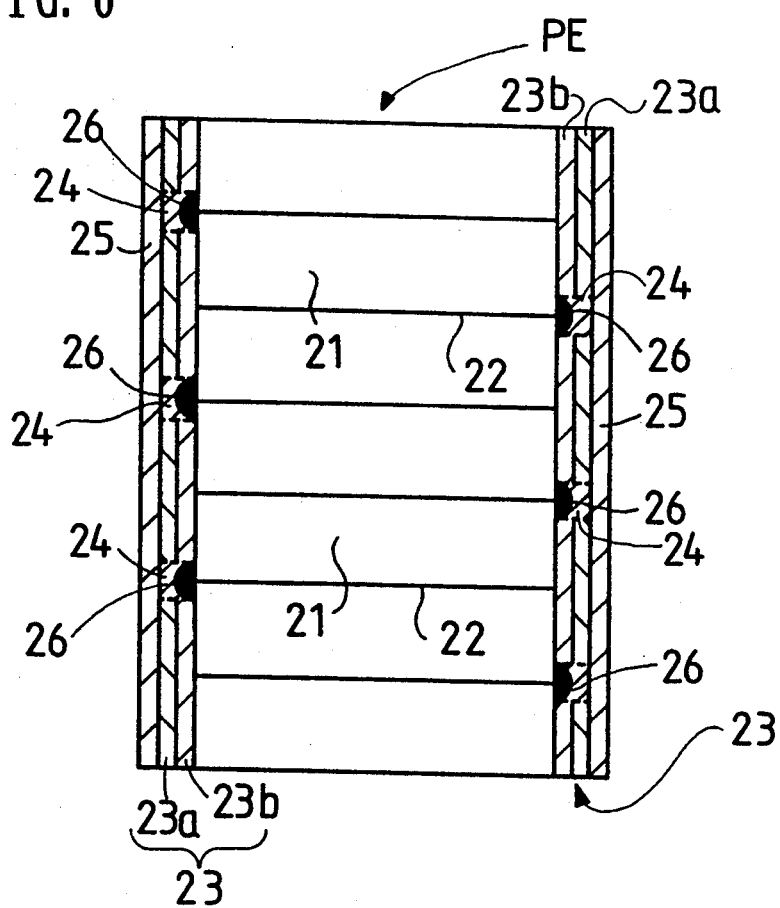
FIG. 6 is a sectional view of a multilayer piezoelectric element according to the second embodiment of the present invention.
Figure 7:
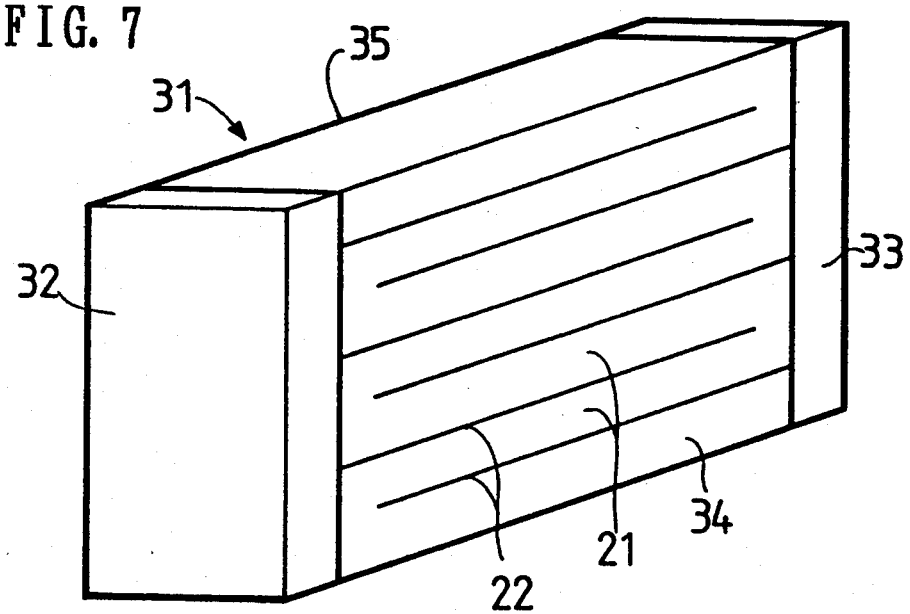
FIG. 7 is a perspective view of a baked multilayer block.

In FIG. 6, a multilayer piezoelectric element PE is constructed by alternately stacking a plurality of piezoelectric plates 21 and a plurality of internal electrodes 22. The piezoelectric element PE has four side surfaces and on each side surface, the piezoelectric plates 21 and the internal electrodes 22 are exposed. And on two side surfaces which opposes with each other, a plurality of conductive protrusions 26 are alternately formed as shown in FIG. 6. In FIG. 6, that is to say, on the left side surface of the element PE, three conductive protrusions 26 in a first group are formed at positions, each corresponding to the first internal electrode 22, the third internal electrode 22 and the fifth internal electrode 22, from the upper surface of the element PE respectively. And on the right side surface of the element PE, three conductive protrusions 26 in a second group are formed at positions, each corresponding to the second internal electrode 22, the fourth internal electrode 22 and the sixth internal electrode 22, from the upper surface of the element PE respectively.

And on the two side surfaces mentioned above, conductive films 23 are attached along a stacking direction of the piezoelectric plates 21 (vertical direction in FIG. 6) so that the conductive films 23 cover all of the piezoelectric plates 21 exposed on each of the two side surfaces.

The conductive film 23 is constructed from two layers 23a and 23b. The first layer 23a is comprised from an adhesive layer which includes conductive particles (mentioned hereinafter) therein. And the second layer 23b is comprised from an adhesive layer which does not include conductive particles (mentioned hereinafter).

Further, in each of the conductive films 23, a plurality of conductive portions 24 are alternately formed so that each conductive portion 24 corresponds and connects to each conductive protrusion 26, as shown in FIG. 6. In FIG. 6, that is to say, in the left conductive film 23, three conductive portions 24 are formed at positions, each corresponding to the first conductive protrusion 26, the third conductive protrusion 26 and the fifth conductive protrusion 26, respectively. And in the right conductive film 23, three conductive portions 24 are formed at positions, each corresponding to the second conductive protrusion 26, the fourth conductive protrusion 26 and the sixth conductive protrusion 26, respectively. Manufacturing process of the conductive protrusions 26 and the conductive portions 24 will be described hereinafter.

Further, on each of the conductive film 23, a copper foil 25 is adhered. The copper foil 25 acts as an external electrode. Based on that the copper foils 25 are formed on the conductive films 23, the first, the third and the fifth internal electrodes 22 are electrically connected to the copper foil 25 formed on the left conductive film 23 through the conductive protrusions 26 and the conductive portions 24 and the second, the fourth and the sixth internal electrodes 22 are electrically connected to the copper foil 25 formed on the right conductive film 23 through the conductive protrusions 26 and the conductive portions 24.

Next, manufacturing process of the multilayer piezoelectric element PE shown in FIG. 6 will be described referring to FIG. 7 through FIG. 12.

At first, piezoelectric material including PZT as main component is prepared in a desired composition and thereafter the piezoelectric material is ground into powder after being provisionally baked at 850° C. And binder of 5 weight parts, plasticizer and defoaming agent of trace quantity are added to the powder of the piezoelectric material and thereafter dispersed in organic solvent into slurry state. And the thus obtained slurry is formed into a sheet form with a predetermined thickness by using doctor-blade method, thereby a green sheet, which is utilized to form the piezoelectric plates 21, is obtained.

Thereafter, palladium (Pd) paste is coated on the green sheet by screen printing method so as to form the internal electrode 22. The green sheet with palladium paste thereon is punched into a predetermined size. A plurality of the punched green sheets are stacked with each other and hot-pressed into one body. After cleaning thereof, the stacked body is baked at about 1200° C. and a baked multilayer block 31 is obtained. The thus formed multilayer block 31 is sliced so that the internal electrodes 22 are alternately disposed on the side surfaces thereof. Thereafter, provisional external electrodes 32 and 33 are formed on the two end portions (the left end and the right end in FIG. 7) by coating and baking the conductive paste. Further, the multilayer block 31 is sliced so that another pair of surfaces 34, 35 (the front surface and the back surface in FIG. 7) are exposed.

Figure 8:
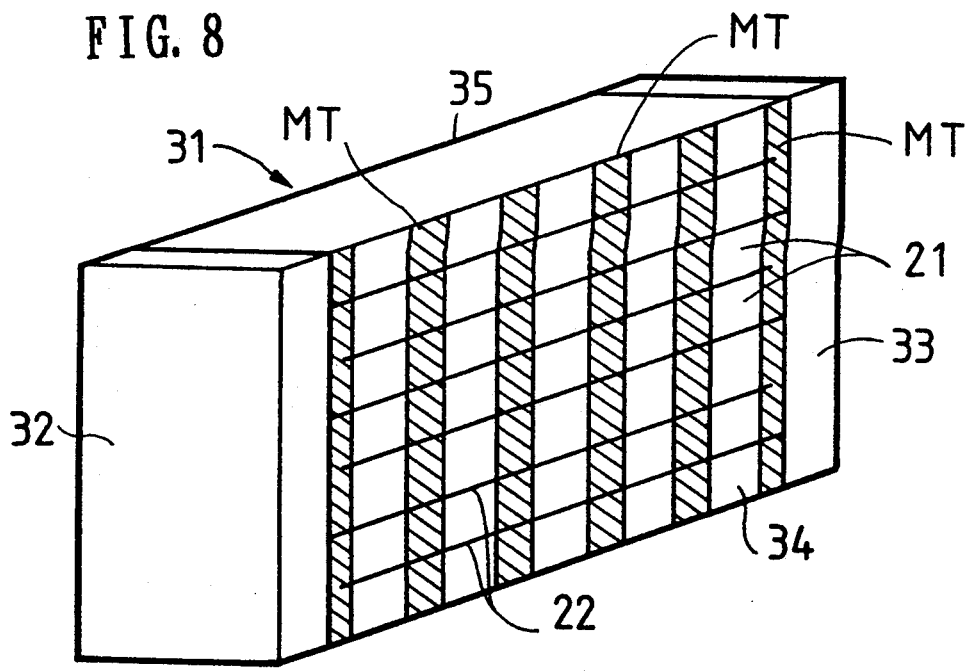
FIG. 8 is a perspective view showing a state where the baked multilayer block is masked by masking tapes.
Figure 9:
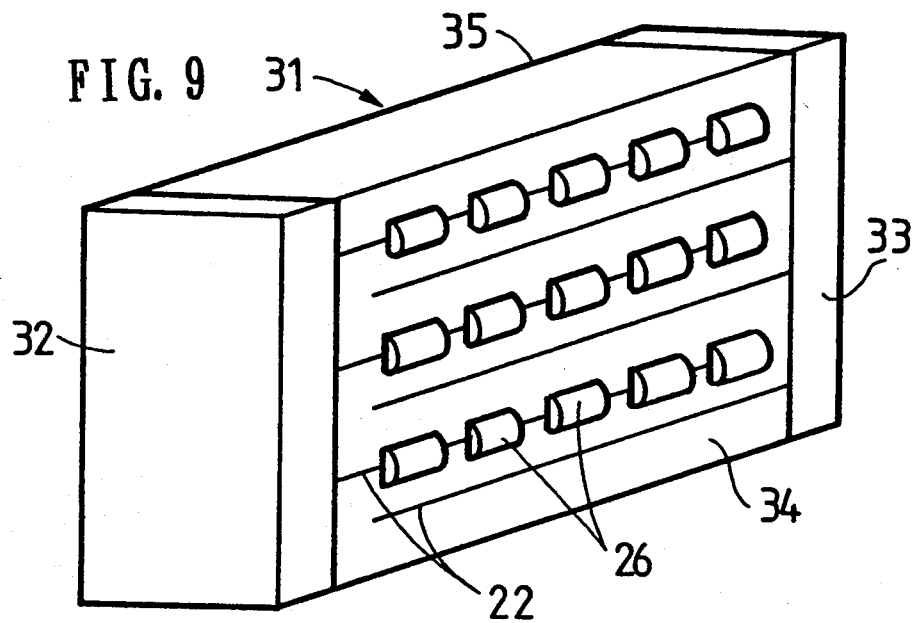
FIG. 9 is a perspective view showing a state where conductive protrusions are formed on end portions that internal electrodes are exposed on the side surface of the piezoelectric element.

And as shown in FIG. 8, the surface 34 of the multilayer block 31 is partially masked by masking tapes MT so that the parts of the surface 34 where the conductive protrusions 26 will be formed are exposed and the parts thereof where the conductive protrusions 26 will not be formed are masked. Similarly, the other surface 35 of the multilayer block 31 is entirely masked by the masking tapes MT. Thereafter, the external electrode 32 is connected to a negative electrode of s direct current source and the multilayer block 31 is bathed in a nickel plating bath. While retaining this state, direct current of 50 mA is applied to the external electrode 32 for about five (5) minutes. As a result, on end surfaces of the internal electrodes 22 which shall be connected to the external electrode 32, nickel plating layer is produced. And after the masking tapes MT are peeled from the surface 34, the conductive protrusions 26 composed of nickel are alternately obtained as shown in FIG. 9.

Similarly to the above, the surface 34 of the multilayer block 31 where the protrusions 26 are formed is entirely masked and the opposite surface 35 thereof is partially masked by the masking tapes MT. Thereafter, direct current of 50 mA is applied to the external electrode 32 for about five (5) minutes. As a result, on end surfaces of the internal electrodes 22 which shall be connected to the external electrode 32, nickel plating layer is produced. And after the masking tapes MT are peeled from the surface 34, the conductive protrusions 26 composed of nickel are alternately obtained. Here, the conductive protrusions 26 on the surface 35 are alternately formed on end surfaces of the different internal electrodes 22 as shown in FIG. 6.

Figure 10:
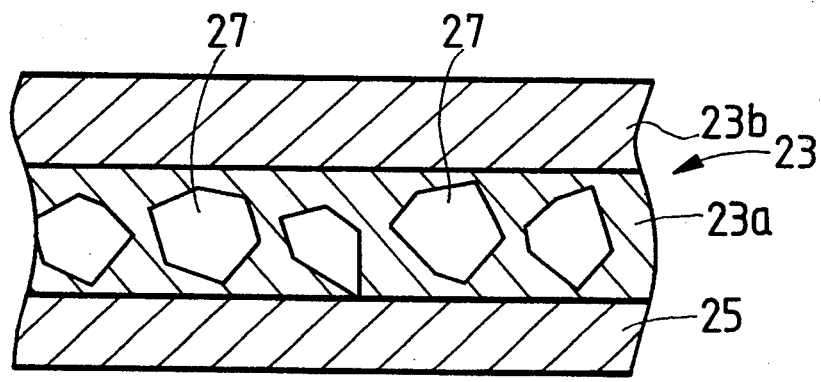
FIG. 10 is a sectional view of a copper foil as an external electrode and a conductive film, both being adhered with each other.

On the other hand, separately from the multilayer block 31, the conductive film 23 is formed on the copper foil 25 as follows. First, as shown in FIG. 10, resinous adhesive including copper powder 27 (conductive particles) with average particle size of 20-30 $\mu$m is coated onto the copper foil 25.

Here, for instance, adhesive composed of thermosetting epoxy resin including the copper powder 27 is coated with a thickness of about 50 $\mu$m onto the copper foil 25 and the coated adhesive is made semi-cured tacky state by heating at a temperature lower than curing point thereof. Further, only the same adhesive not including the copper powder 27 is uniformly coated onto the tacky adhesive already coated on the copper foil 25 and heated into a tacky state. Thereby, the first layer 23a composed of epoxy resin adhesive including the copper powder 27 as the conductive particles and the second layer 23b only composed of epoxy resin adhesive, are formed on the copper foil 25. According to this, the conductive film 23 is concluded to have double-layered structure.

Figure 11:
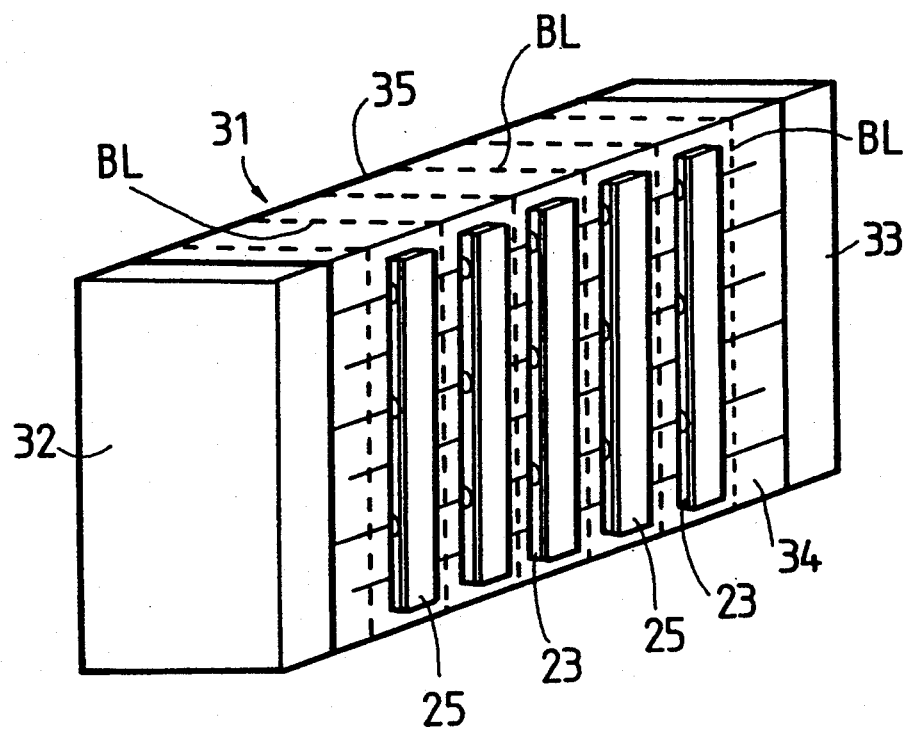
FIG. 11 is a perspective view of the baked multilayer block after the conductive film and the copper foil are formed on the side surface of the block.

Thereafter, the conductive film 23 with the copper foil 25 prepared according to the above is cut with a width narrower than that of the piezoelectric element unit, then the conductive films 23 which are cut out are provisionally adhered onto two side surfaces of the piezoelectric element unit, each side surface opposing with each other, so that the conductive film 23 covers all of the piezoelectric plates 21 exposed thereon, as shown in FIG. 11.

Figure 12:
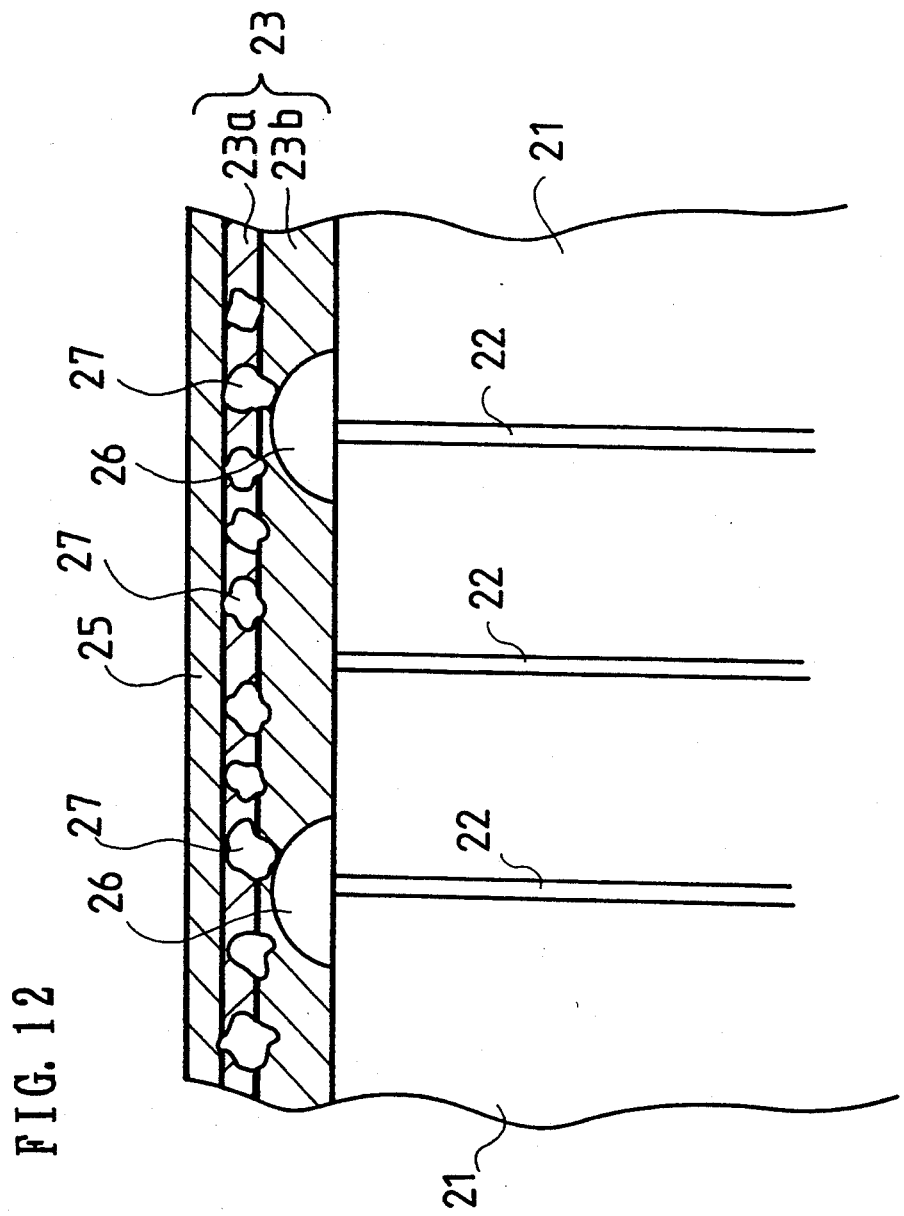
FIG. 12 is a schematic sectional view to explain a state where conductive portions are formed in the conductive film by partially pressing thereof.
Figure 13:
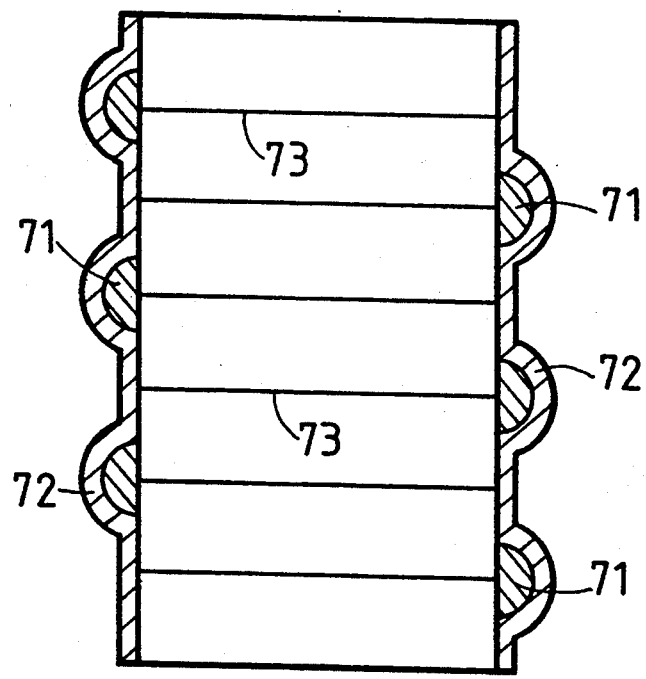
FIG. 13 is a sectional view of a conventional multilayer piezoelectric element.
Figure 15:
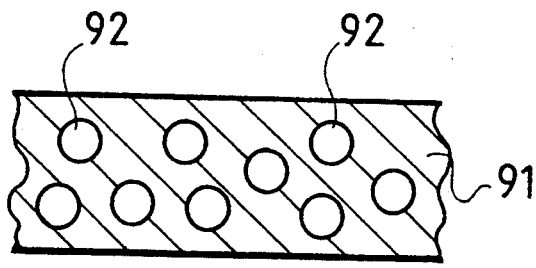
FIG. 15 is a sectional view of an anisotropic conductive film which is conventionally used.

And after the conductive films 23 with the copper foils 25 are attached on both side surfaces of the multilayer block 31, they are clamped and heated for 30 minutes with weight of several kg from the both side surfaces by a pair of flat pressing devices (not shown) which are heated at about 150° C. Thereby, as shown in FIG. 12, the conductive films 23 are pressed so that only the portions opposing to the conductive protrusions 26 are partially pressed with higher pressure than that loaded onto the other portions thereof. As a result, only at the pressed portions, the conductive particles (copper powder) 27 included in pressed portions of the first layer 23a pierces the second layer 23b not including the conductive particles 27, as shown in FIG. 12 and thereby the conductive particles 27 are contacted to the conductive protrusions 26 and further to the copper foil 25. By this way, the conductive portions 24 are formed in the conductive film 13 as shown in FIG. 6. Therefore, the internal electrodes 12 are alternately and electrically connected to the copper foil 15 acting as the external electrode through the conductive protrusions 26 and the conductive portions 24.

The thus obtained multilayer block 31 is sliced according to broken lines BL shown in FIG. 11 and a plurality of the multilayer piezoelectric element PE are cut out therefrom. Further, lead line for supplying voltage is attached to a part of the copper foil 25 and the thus constructed multilayer piezoelectric element PE is polarized and installed in a cover case.

While the invention has been particularly shown and described with reference to preferred embodiments thereof, it will be understood by those skilled in the art that the foregoing and other changes in form and details can be made therein without departing from the spirit and scope of the invention.

For instance, in the first embodiment, though the copper powder 17 is used as the conductive particles, metal powder including nickel particles, aluminium particles, invar alloy particles, silver particles or stainless steel particles can be used as the conductive particles, instead thereof. And it is conceivable that the element unit 6 on two side surfaces of which the conductive film 13 and the copper foil 15 are hot-pressed, will be clamped and pressed by a pair of the pressing devices 16 from the both side surfaces so that the projections 16a in one of the devices 16 are positioned at concave portions (formed between the projections 16a) in the other device 16. In such case, two side surfaces of the element unit 6 can be pressed at the same time. And in case that one of the copper foil 15 is extended, the extended portion of the copper foil 15 can use as the lead line.

Further, in the second embodiment, metal powder including nickel particles, aluminium particles, invar alloy particles, carbon particles, silver particles or stainless steel particles can be used as the conductive particles, instead of the copper powder 27. And mixture of the above metal particles such as nickel particles, aluminium particles, invar alloy particles, carbon particles, silver particles can be also used as the conductive particles. Furthermore, though the conductive protrusions 26 are formed by nickel plating, chromium plating or copper plating can be utilized to form the conductive protrusions 26 instead of nickel plating. And it is conceivable that conductive tape can be used instead of the copper foil 25 and in case that one of the copper foil 25 is extended, the extended portion of the copper foil 25 can use as the lead line.

And both in the first embodiment and the second embodiment, it is conceivable that the second layer 13b in the conductive film 13 and the second layer 23b in the conductive film 23, both acting as insulating layers, are prepared by electrodeposition coating as follows. That is to say, in electrodeposition coating, the element unit 6 in the first embodiment (in case of the second embodiment, the multilayer block 31 after the conductive protrusions 26 are formed) are bathed in a coating bath which is filled with coating solution that epoxy resin particles with a size of several tens μm and pigments are dispersed in water. Thereafter, a voltage of several hundreds volts is applied to the coating bath.

Thereby, in case of the first embodiment, insulating layer composed of epoxy resin and pigments is formed on portions where the inner electrodes 12 are exposed. And similarly to the above, in case of the second embodiment, insulating layer composed of epoxy resin and pigments is formed on the conductive protrusions 26 and portions where the inner electrodes 22 are exposed. Thereafter, the element unit 6 in the first embodiment or the multilayer block 31 is heated, thereby the insulating layer is melted and covers the side surfaces of the element unit 6 or the multilayer block 31. As a result, the second layer 13b in the first embodiment and the second layer 23b in the second embodiment is formed.

Further, in the first embodiment, the copper foil 15 with the first layer 13a prepared through the same method mentioned above is adhered onto the second layer 13b and the piezoelectric element PE is obtained after selectively pressing the side surfaces of the element unit 6 similarly to the above. And in the second embodiment, the copper foil 25 with the first layer 23a prepared through the same method mentioned above is adhered onto the second layer 23b and the piezoelectric element PE is obtained after selectively pressing of the side surfaces of the multilayer block 31 similarly to the above and slicing thereof.

What is claimed is:

1. A multilayer piezoelectric element having a first and a second side surfaces opposing with each other in which a plurality of piezoelectric layers and a plurality of internal electrodes are alternately stacked with each other, the multilayer piezoelectric element comprising:
   a pair of conductive layers which are formed on the first and the second side surfaces of the multilayer piezoelectric element so as to cover the internal electrodes exposed on the first and the second side surfaces, the conductive layer having a first layer in which conductive particles are included and a second insulating layer and conductive portions being formed in the conductive layers based on the conductive particles in the first layer; and
   a pair of external electrodes which are formed on the conductive layers on both the first and the second side surfaces, the external electrode being electrically connected to the internal electrodes through the conductive portions formed in the conductive layer.

2. The multilayer piezoelectric element according to claim 1, wherein the conductive particles in the first layer pierces the second insulating layer into contact with the internal electrodes at positions selectively pressed by a pressing device, thereby the conductive portions are formed in the conductive layer.

3. The multilayer piezoelectric element according to claim 2, wherein the conductive portions are alternately formed in the conductive layer on the first side surface corresponding to a first group of the internal electrodes and are alternately formed in the conductive layer on the second side surface corresponding to a second group of the internal electrodes different from the internal electrodes in the first group.

4. The multilayer piezoelectric element according to claim 1, wherein the piezoelectric layer is composed of piezoelectric material including PZT as a main component.

5. The multilayer piezoelectric element according to claim 1, wherein the internal electrode is formed by coating conductive paste on the piezoelectric layer.

6. The multilayer piezoelectric element according to claim 5, wherein the conductive paste is noble metal paste.

7. The multilayer piezoelectric element according to claim 6, wherein the noble metal paste is one of palladium paste, silver paste and platinum paste.

8. The multilayer piezoelectric element according to claim 1, wherein the conductive layer is formed by attaching a conductive film having the first layer and the second insulating layer onto the first or the second side surface.

9. The multilayer piezoelectric element according to claim 8, wherein the first layer is composed from an adhesive layer in which the conductive particles are dispersed and the second insulating layer is composed from an adhesive layer without conductive particles.

10. The multilayer piezoelectric element according to claim 9, wherein the adhesive layer is composed of thermosetting resin.

11. The multilayer piezoelectric element according to claim 10, wherein the thermosetting resin is epoxy resin.

12. The multilayer piezoelectric element according to claim 1, wherein the conductive particles are composed from metal particles.

13. The multilayer piezoelectric element according to claim 12, wherein the metal particles have an average particle size lying in a range of 20–30 μm.

14. The multilayer piezoelectric element according to claim 12, wherein the metal particles are selected from a group consisting of copper particles, nickel particles, aluminium particles, invar alloy particles, silver particles and stainless steel particles.

15. The multilayer piezoelectric element according to claim 1, wherein the external electrode is formed from copper foil hot-pressed onto the conductive layer.

16. A multilayer piezoelectric element having a first and a second side surfaces opposing with each other in which a plurality of piezoelectric layers and a plurality of internal electrodes are alternately stacked with each other, the multilayer piezoelectric element comprising:
   a plurality of conductive protrusions alternately formed at end positions of the internal electrodes exposed on both the first and the second side surfaces;
   a pair of conductive layers which are formed on the first and the second side surfaces of the multilayer piezoelectric element so as to cover the internal electrodes exposed on the first and the second side surfaces, the conductive layer having a first layer in which conductive particles are included and a second insulating layer and conductive portions being formed in the conductive layers based on the conductive particles in the first layer; and
   a pair of external electrodes which are formed on the conductive layers on both the first and the second side surfaces, the external electrode being electrically connected to the internal electrodes through the conductive protrusions and the conductive portions formed in the conductive layer.

17. The multilayer piezoelectric element according to claim 16, wherein the conductive particles in the first layer pierces the second insulating layer into contact with the internal electrodes at positions selectively pressed by a pressing device, thereby the conductive portions are formed in the conductive layer.

18. The multilayer piezoelectric element according to claim 17, wherein the conductive protrusions are formed corresponding to a first group of the internal electrodes exposed on the first side surface and are formed corresponding to a second group of the internal electrodes on the second side surface different from the internal electrodes in the first group.

19. The multilayer piezoelectric element according to claim 18, wherein the conductive portions are formed in the conductive layer by being pressed in cooperation with the conductive protrusions when pressed through a pressing device.

20. The multilayer piezoelectric element according to claim 19, wherein the conductive portions formed in the conductive layer on the first side surface corresponds to the conductive protrusions on the first side surface and the conductive portions formed in the conductive layer on the second side surface corresponds to the conductive protrusions on the second side surface.

21. The multilayer piezoelectric element according to claim 16, wherein the conductive protrusions are formed by metal plating.

22. The multilayer piezoelectric element according to claim 21, wherein the metal plating is nickel plating.

23. The multilayer piezoelectric element according to claim 16, wherein the piezoelectric layer is composed of piezoelectric material including PZT as a main component.

24. The multilayer piezoelectric element according to claim 16, wherein the internal electrode is formed by coating conductive paste on the piezoelectric layer.

25. The multilayer piezoelectric element according to claim 24, wherein the conductive paste is noble metal paste.

26. The multilayer piezoelectric element according to claim 25, wherein the noble metal paste is one of palladium paste, silver paste and platinum paste.

27. The multilayer piezoelectric element according to claim 16, wherein the conductive layer is formed by attaching a conductive film having the first layer and the second insulating layer onto the first or the second side surface.

28. The multilayer piezoelectric element according to claim 27, wherein the first layer is composed from an adhesive layer in which the conductive particles are dispersed and the second insulating layer is composed from an adhesive layer without conductive particles.

29. The multilayer piezoelectric element according to claim 28, wherein the adhesive layer is composed of thermosetting resin.

30. The multilayer piezoelectric element according to claim 29, wherein the thermosetting resin is epoxy resin.

31. The multilayer piezoelectric element according to claim 16, wherein the conductive particles are composed from metal particles.

32. The multilayer piezoelectric element according to claim 31, wherein the metal particles have an average particle size lying in a range of 20–30 $\mu$m.

33. The multilayer piezoelectric element according to claim 32, wherein the metal particles are selected from a group consisting of copper particles, nickel particles, aluminium particles, invar alloy particles, silver particles and stainless steel particles.

34. The multilayer piezoelectric element according to claim 16, wherein the external electrode is formed from copper foil hot-pressed onto the conductive layer.

35. The multilayer piezoelectric element according to claim 9, wherein the second insulating layer is formed through electrodeposition coating.

36. The multilayer piezoelectric element according to claim 28, wherein the second insulating layer is formed through electrodeposition coating.

* * * * *